(12) United States Patent
Mizokuchi

(10) Patent No.: US 6,218,875 B1
(45) Date of Patent: Apr. 17, 2001

(54) HIGH SPEED LOCK-UP PHASE LOCKED LOOP CIRCUIT

(75) Inventor: Makoto Mizokuchi, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/292,881

(22) Filed: Apr. 16, 1999

(30) Foreign Application Priority Data

Apr. 16, 1998 (JP) .................................................. 10-106681

(51) Int. Cl.[7] ........................................................ H03L 7/06
(52) U.S. Cl. ............................................. 327/156; 331/17
(58) Field of Search .................................. 327/156–159, 327/162, 163, 147–150; 331/17, 25, DIG. 2

(56) References Cited

U.S. PATENT DOCUMENTS

| | | | | |
|---|---|---|---|---|
| 5,406,590 | * | 4/1995 | Miller et al. | 327/159 |
| 5,781,048 | * | 7/1998 | Nakao et al. | 327/156 |
| 5,889,438 | * | 3/1999 | Yamaguchi | 327/156 |
| 5,923,196 | * | 7/1999 | Okamoto | 327/156 |
| 5,926,515 | * | 7/1999 | Park | 331/25 |
| 5,929,677 | * | 7/1999 | Murata | 327/156 |
| 5,977,806 | * | 11/1999 | Kikuchi | 327/157 |
| 5,978,427 | * | 11/1999 | Kuhara | 331/17 |
| 5,982,208 | * | 11/1999 | Kokubo et sl. | 327/159 |
| 5,982,239 | * | 11/1999 | Takahashi et al. | 327/159 |
| 5,986,486 | * | 11/1999 | Nichols | 327/156 |
| 6,037,814 | * | 3/2000 | Hirakawa | 327/156 |
| 6,043,695 | * | 3/2000 | O'Sullivan | 327/157 |
| 6,097,255 | * | 8/2000 | Tachi | 327/159 |

FOREIGN PATENT DOCUMENTS

| | | |
|---|---|---|
| 54-108669 | 8/1979 | (JP) . |
| 59-171418 | 11/1984 | (JP) . |
| 62-216420 | 9/1987 | (JP) . |
| 63-44522 | 3/1988 | (JP) . |
| 63-124623 | 5/1988 | (JP) . |
| 63-165931 | 10/1988 | (JP) . |
| 4-157923 | 5/1992 | (JP) . |
| 6-276090 | 9/1994 | (JP) . |
| 7-86930 | 3/1995 | (JP) . |
| 9-200045 | 7/1997 | (JP) . |

* cited by examiner

Primary Examiner—Terry D. Cunningham
Assistant Examiner—Long Nguyen
(74) Attorney, Agent, or Firm—Young & Thompson

(57) ABSTRACT

A circuitry for controlling a response speed of a phase locked loop circuit includes a response speed switching circuit having at least one resistive element with a resistance; and a switching operation control circuit being connected to a phase comparator in the phase locked loop circuit for receiving output signals from the phase comparator, and the switching operation control circuit being also connected to the response speed switching circuit for transmitting selected one of first and second switching control signals to the response speed switching circuit, so that if the response speed switching circuit receives the first switching control signal from the switching operation control circuit, then the response speed switching circuit becomes connected to the phase locked loop circuit, whereby the at least one resistive element becomes connected in parallel to the phase locked loop circuit so as to place the phase locked loop circuit into a high speed response state, and so that if the response speed switching circuit receives the second switching control signal from the switching operation control circuit, then the response speed switching circuit becomes disconnected from the phase locked loop circuit, whereby the at least one resistive element becomes disconnected from the phase locked loop circuit so as to place the phase locked loop circuit into a low speed response state.

9 Claims, 4 Drawing Sheets

HIGH SPEED LOCK-UP PHASE LOCKED LOOP CIRCUIT

BACKGROUND OF THE INVENTION

The present invention relates to a high speed lock-up phase locked loop circuit, and more particularly to a high speed lock-up phase locked loop circuit capable of form switching between two states of a high speed response circuit enabling a high speed lock-up operation and a low speed response circuit realizing a low noise.

In Japanese laid-open patent publication No. 9-8655, it is disclosed that the high speed lock-up low noise phase locked loop circuit uses two phase comparators with different characteristics. FIG. 1 is a block diagram illustrative of a conventional high speed lock-up low noise phase locked loop circuit. This conventional high speed lock-up low noise phase locked loop circuit has a loop filter 3, a programmable divider 4, a voltage control oscillator 5 connected to the programmable divider 4 for sending the output from the voltage control oscillator 5 to the programmable divider 4, an overlap output phase comparator 6 connected to the programmable divider 4 for receiving both the output from the programmable divider 4 and a reference signal 1 externally inputted to compare the output from the programmable divider 4 with reference to the reference signal 1, a non-overlap output phase comparator 7 connected to the programmable divider 4 for receiving both the output from the programmable divider 4 and the reference signal 1 to compare the output from the programmable divider 4 with reference to the reference signal 1, a first charge pump circuit 8 connected to the overlap output phase comparator 6 for receiving the outputs from the overlap output phase comparator 6, and a second charge pump circuit 9 connected to the non-overlap output phase comparator 7 for receiving the outputs from the non-overlap output phase comparator 7. The above loop filter 3 are also connected to the output sides of the overlap output phase comparator 6 and the non-overlap output phase comparator 7 for receiving the individual outputs from the overlap output phase comparator 6 and the non-overlap output phase comparator 7. The voltage control oscillator 5 is also connected to the loop filter 3 for receiving the output from the loop filter 3. The output from the voltage control oscillator 5 is fetched as the output signal 2 as the above conventional high speed lock-up low noise phase locked loop circuit.

The following description ill focus on the operations of the above conventional high speed lock-up low noise phase locked loop circuit. The non-overlap output phase comparator 7 compares the output from the programmable divider 4 with reference to the reference signal 1 in phase so as to detect a phase difference of the output signal from the programmable divider 4 from the reference signal 1. If the detected phase difference of the output signal from the programmable divider 4 from the reference signal 1 is within a predetermined allowable range, the the non-overlap output phase comparator 7 is operated to output no phase difference signal about of the phase difference. The overlap output phase comparator 6 also compares the output from the programmable divider 4 with reference to the reference signal 1 in phase so as to detect the phase difference of the output signal from the programmable divider 4 from the reference signal 1. If the detected phase difference of the output signal from the programmable divider 4 from the reference signal 1 is within the predetermined allowable range, then the overlap output phase comparator 6 is operated to output no phase difference signal about of the phase difference.

For example, in an initial state of switching the frequency, the phase difference of the output signal from the programmable divider 4 from the reference signal 1 is likely to be large. If the phase difference is large or beyond the predetermined allowable range, then the overlap output phase comparator 6 is operated to output the phase difference signal which is transmitted to the first charge pump circuit 8, and also the non-overlap output phase comparator 7 is operated to output the phase difference signal which is also transmitted to the second charge pump circuit 9. The loop filter 3 is driven by the first and second charge pump circuits 8 and 9, whereby the high speed lock-up low noise phase locked loop circuit exhibits high speed performances.

After a predetermined time has been passed from the commencement of switching the frequency, the phase difference of the output signal from the programmable divider 4 from the reference signal 1 is likely to comes small to be within the predetermined allowable range. If the phase difference is large or beyond the predetermined allowable range, then the overlap output phase comparator 6 and the non-overlap output phase comparator 7 are operated to output no phase difference signals. The loop filter 3 is not driven by only the first charge pump circuit 8, whereby the high speed lock-up low noise phase locked loop circuit exhibits low speed and low noise performances.

The above high speed lock-up low noise phase locked loop circuit is switched between two different states of the high speed and low speed responsibilities by the two phase comparators.

The above high speed lock-up low noise phase locked loop circuit has a problem in providing the two phase comparators, which results in a large scale of the circuits.

The above high speed lock-up low noise phase locked loop circuit has another problem in a difficulty to charge or vary the predetermined allowable range which provides a critical range of whether or not the phase difference signals are outputted from the overlap output phase comparator 6 and the non-overlap output phase comparator 7. This difficulty to charge or vary the predetermined allowable range means it also difficult to adjust a critical value of switching the circuit performances between the high speed and low speed responses.

In the above circumstances, it had been required to develop a novel high speed lock-up phase locked loop circuit free from the above problems.

SUMMARY OF THE INVENTION

Accordingly, it is an object of the present invention to provide a novel high speed lock-up phase locked loop circuit free from the above problems.

It is a further object of the present invention to provide a novel high speed lock-up phase locked loop circuit with no need to provide the two phase comparators.

It is a still further object of the present invention to provide a novel high speed lock-up phase locked loop circuit with a reduced circuit scale.

It is yet a further object of the present invention to provide a novel high speed lock-up phase locked loop circuit capable of charging or varying the predetermined allowable range which provides a critical range of whether or not the phase difference signals are outputted from the overlap output phase comparator and the non-overlap output phase comparator.

It is a further object of the present invention to provide a novel high speed lock-up phase locked loop circuit capable of adjusting a critical value of switching the circuit performances between the high speed and low speed responses.

It is still more object of the present invention to provide a novel high speed lock-up phase locked loop circuit capable of preventing any deterioration in characteristics and performances of the circuit.

The present invention provides a circuitry for controlling a response speed of a phase locked loop circuit. The circuitry comprises: a response speed switching circuit having at least one resistive element with a resistance; and a switching operation control circuit being connected to a phase comparator in the phase locked loop circuit for receiving output signals from the phase comparator, and the switching operation control circuit being also connected to the response speed switching circuit for transmitting selected one of first and second switching control signals to the response speed switching circuit, so that if the response speed switching circuit receives the first switching control signal from the switching operation control circuit, then the response speed switching circuit becomes connected to the phase locked loop circuit, whereby the at least one resistive element becomes connected in parallel to the phase locked loop circuit so as to place the phase locked loop circuit into a high speed response state, and so that if the response speed switching circuit receives the second switching control signal from the switching operation control circuit, then the response speed switching circuit becomes disconnected from the phase locked loop circuit, whereby the at least one resistive element becomes disconnected from the phase locked loop circuit so as to place the phase locked loop circuit into a low speed response state.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
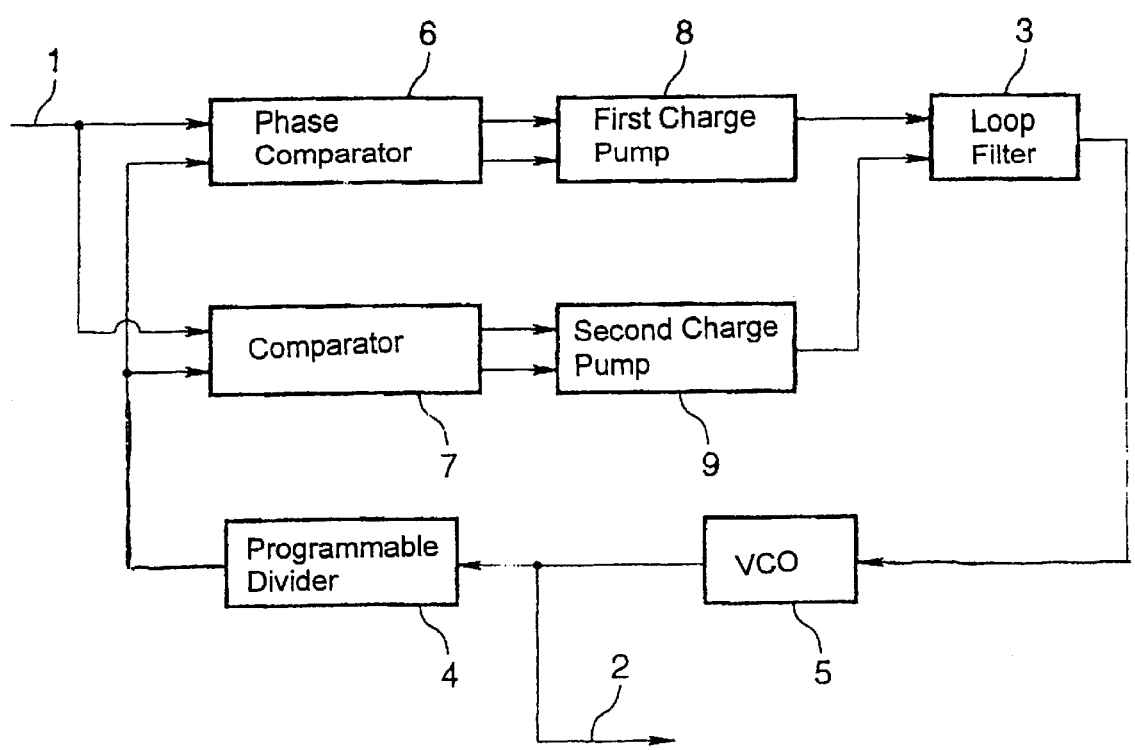
FIG. 1 is a block diagram illustrative of a conventional high speed lock-up low noise phase locked loop circuit.

The present invention provides a circuitry for controlling a response speed of a phase locked loop circuit. The circuitry comprises: a response speed switching circuit having at least one resistive element with a resistance; and a switching operation control circuit being connected to a phase comparator in the phase locked loop circuit for receiving output signals from the phase comparator, and the switching operation control circuit being also connected to the response speed switching circuit for transmitting selected one of first and second switching control signals to the response speed switching circuit, so that if the response speed switching circuit receives the first switching control signal from the switching operation control circuit, then the response speed switching circuit becomes connected to the phase locked loop circuit, whereby the at least one resistive element becomes connected in parallel to the phase locked loop circuit so as to place the phase locked loop circuit into a high speed response state, and so that if the response speed switching circuit receives the second switching control signal from the switching operation control circuit, then the response speed switching circuit becomes disconnected from the phase locked loop circuit, whereby the at least one resistive element becomes disconnected from the phase locked loop circuit so as to place the phase locked loop circuit into a low speed response state.

It is preferable that the response speed switching circuit has at least one series connection of an error out terminal and a resistance as the resistive element, and the error out terminal is switched between in an operational state in accordance with an input of the first switching control signal and in a high impedance state as an unoperational state in accordance with an input of the second switching control signal.

The circuitry, wherein the resistance of the response speed switching circuit is common to a low pass filter of the phase locked loop circuit, and the error out terminal of the response speed switching circuit is connected to the low pass filter.

It is further preferable that the switching operation control circuit has an error detector connected to the phase comparator of the phase locked loop circuit for receiving an output signal from the phase comparator in order to detect whether or not a phase difference detected by the phase comparator is within a predetermined allowable range, so that if the phase difference is within the predetermined allowable range, then the error detector is made into an inactive state to allow the error out terminal to be placed into the high impedance state, and so that if the phase difference is beyond the predetermined allowable range, then the error detector is made into an active state to allow the error out terminal to be placed into the operational state.

It is further more preferable that the error detector comprises an error detecting flag.

It is also preferable that the switching operation control circuit further comprises at least one error out switching element connected to the error detector and also connected to the error out terminal for switching the error out terminal into the high impedance state only when the error detector is in the inactive state to allow the response speed switching circuit to become disconnected from the phase locked loop circuit.

It is further more preferable that the error out switching element comprises an error out switching flag.

It is also preferable that the error detector receives an input signal which comprises a logical sum of first and second output signals being supplied from the phase comparator to the at least one error output terminal.

The above novel circuitry is applicable to a phase locked loop circuit comprising: a voltage control oscillator; a divider connected to the voltage control oscillator for receiving an output signal from the voltage control oscillator; a single phase comparator connected to the divider for receiving an output signal form the divider and also receiving a reference signal in order to compare the output signal with reference to the reference signal; a first error out terminal connected to the signal phase comparator for receiving output signals from the single phase comparator; a low pass filter connected to the first error out terminal for receiving an output signal from the first error out terminal, and also connected to the voltage control oscillator for sending an output signal from the low pass filter to the voltage control oscillator; and a circuitry connected to both the signal phase comparator and the low pass filter for receiving an output signal from the single phase comparator in order to control a response speed of the phase locked loop circuit in accordance with the output signal from the single phase comparator.

In accordance with the above novel high speed lock-up phase locked loop circuit, there are provided the single phase comparator 21 and the response speed switching circuit 31 as well as the control circuit 39. The control circuit 39 controls switching operations of switching the response speed switching circuit 31 to be connected to the novel high speed lock-up phase locked loop circuit so as to place the novel high speed lock-up phase locked loop circuit into the high response state or disconnected from the novel high speed lock-up phase locked loop circuit so as to place the novel high speed lock-up phase locked loop circuit into the low response state. The above novel high speed lock-up phase locked loop circuit is configured by use of the first and second error out terminals, for which reason the above novel high speed lock-up phase locked loop circuit is allowed to be switched between into the high response speed state and into the low response speed state without, however, enlarging any circuit scale.

The above novel high speed lock-up phase locked loop circuit has a plurality of the error out terminals, at least one of which is connected to an error out terminal control circuit for switching the one error out terminal into the high impedance state. Only when the error out terminals are in the high impedance state, the error out terminal is allowed to be switched in driving current, for which reason the above novel high speed lock-up phase locked loop circuit is free from any deteriorations in characteristics and performances due to the discontinuity in frequency and switching noises when the error out terminal is switched in driving current.

The error detection flag is provided for monitoring the errors of the single phase comparator, so that the error detection flag is monitored every constant time period so as to detect a difference in phase or frequency of the divided outputs from the divider circuits with reference to the reference signal, whereby after the difference in phase or frequency of the divided outputs from the divider circuits with reference to the reference signal has been converged into a predetermined allowable range, then the response speed switching circuit is switched to become connected to or disconnected from the high speed lock-up phase locked loop circuit, thereby switching the high speed lock-up phase locked loop circuit into the high speed response state or into the low speed response state.

The error out switching flag is provided to switch at least one of the plural error out terminals into the high impedance state, so as to control the timing of switching the error out terminal into the high impedance state and the operational state.

A first embodiment according to the present invention will be described in detail with reference to FIG. 2 which is a block diagram illustrative of a novel high speed lock-up low noise phase locked loop circuit. The novel high speed lock-up phase locked loop circuit has the following circuit elements. A single phase comparator 21 is provided which may reduce a circuit scale. A divider circuit 22 is also provided which has an output side connected to an input side of the phase comparator 21 for allowing the single phase comparator 21 receives an output signal from the divider circuit 22. The single phase comparator 21 also also receives a reference signal 32 for carrying out a phase comparison between the output signal from the divider circuit 22 with reference to the reference signal 32 so that the single phase comparator 21 is operable to output an UP-signal 35, a DOWN-signal 36, and an UP+DOWN signal 37 which corresponds to a logical sum of the UP-signal 35 and the DOWN-signal 36. A voltage control oscillator 23 is provided which has an output side connected to an input side of the divider circuit 22 for transmitting an output signal 33 from the voltage control oscillator 23 to the divider circuit 22. This output signal is also fetched as the output signal of the novel high speed lock-up low noise phase locked loop circuit. A low pass filter 24 is also provided which has an output side connected to an input side of the voltage control oscillator 23 for transmitting a low pass filter output signal 55 from the low pass filter 24 to the voltage control oscillator 23. A first error out terminal 25 is provided which is connected to both a first input terminal 24-1 of the low pass filter 24 and output terminals of the single phase comparator 21 for receiving both the UP-signal 35 and the DOWN-signal 36 from the single phase comparator 21. A response speed switching circuit 31 is also provided which has an input side connected to the output side of the single phase comparator 21 for receiving both the UP-signal 35 and the DOWN-signal 36 from the single phase comparator 21. The response speed switching circuit 31 is also provided which has an output side connected to the low pass filter 24. The low pass filter 24 has a first resistance 28 connected in series between the first input terminal 24-1 and the voltage control oscillator 23, a second resistance 29 connected in series between the second input terminal 24-2 and the voltage control oscillator 23, and a capacitor 30 connected in series between the ground line and the voltage control oscillator 23. The response speed switching circuit 31 also has a second error out terminal 26 which is connected to both the second input terminal 24-2 of the low pass filter 24 and the output terminals of the single phase comparator 21 for receiving both the UP-signal 35 and the DOWN-signal 36 from the single phase comparator 21 as well as commonly has the second resistance 29 to the low pass filter 24. An error out terminal control circuit 39 is also provided which has an input side connected to the output side of the single phase comparator 2 for receiving, from the single phase comparator 21, the UP+DOWN signal 37 which corresponds to the logical sum of the UP-signal 35 and the DOWN-signal 36. The error out terminal control circuit 39 also receives a reset signal "RESETN". The error out terminal control circuit 39 has an output side connected to the second error out terminal 26 for transmitting an output signal from the error out terminal control circuit 39. The error out terminal control circuit 39 further comprises a phase difference defective flag 34 and an error out switching flag 27. The phase difference defective flag 34 has an input side connected to the output side of the single phase comparator 21 for receiving, from the single phase comparator 21, the UP+DOWN signal 37 which corresponds to the logical sum of the UP-signal 35 and the DOWN-signal 36. The error out switching flag 27 has an input side connected to the output from the phase difference defective flag 34. The error out switching flag 27 also receives the reset signal "RESETN". The error out switching flag 27 has an output side connected to the second error out terminal 26 for transmitting the output signal from the error out switching flag 27 to the second error out terminal 26.

The following descriptions will focus on the operations of the above novel high speed lock-up phase locked loop circuit with reference again to FIG. 2.

The reference signal 32 and the output signal from the divider circuit 22 are inputted into the single phase comparator 21 so that the single phase comparator 21 is operated to compare the output signal from the divider circuit 22 with reference to the reference signal 32 in order to detect a phase difference of the output signal from the reference signal 32 and outputs the three output signals, for example, the UP-signal 35, the DOWN-signal 36 and the UP+DOWN signal 37 which corresponds to the logical sum of the UP-signal 35 and the DOWN-signal 36. The UP-signal 35 and the DOWN-signal 36 from the single phase comparator 21 are inputted into the first error out terminal 25 so that the first error out terminal 25 outputs, a high level signal "H", a low level signal "L" and a high impedance. The second error out terminal 26 receives the UP-signal 35 and the DOWN-signal 36 from the single phase comparator 21 as well as the output signal from the error out switching flag 27. The output signal from the first error out terminal 25 is inputted into the first terminal 24-1 of the low pass filter 24 so that the first resistance 28 receives the output signal from the first error out terminal 25. The output signal from the second error out terminal 26 is inputted into the second terminal 24-2 of the low pass filter 24 so that the second resistance 29 receives the output signal from the second error out terminal 26.

The error detective flag 34 receives the UP+DOWN signal 37 from the single phase comparator 21. The UP+DOWN signal 37 corresponds to the logical sum of the UP-signal 35 and the DOWN-signal 36, for which reason if at least any one of the UP-signal 35 and the DOWN-signal 36 is in an activated state, then the UP+DOWN signal 37 is in an active state. Only if both the UP-signal 35 and the DOWN-signal 36 are in an inactivated state, then the UP+DOWN signal 37 is in an inactive state. If the UP+DOWN signal 37 is in the active state, then the error detective flag 34 is made set. If, however, the UP+DOWN signal 37 is in the inactive state, then the error detective flag 34 is made reset. The error out switching flag 27 is connected to the second error out terminal 26 for switching the second error out terminal 26 between in an operational state and a high impedance unoperational state. The error out switching flag 27 is made reset by the input of the reset signal "RESETN". The error out switching flag 27 is made set by a software program executed by an external microcomputer externally provided. The error out switching flag 27 is allowed to change the output but one time only when the error detective flag 34 is in an inactive state after the error but switching flag 27 has been made reset. If the error detective flag 34 is in this inactive state, then this means that all of the first and second error out terminals 25 and 26 are in the high impedance state.

The voltage control oscillator circuit 23 is capable of varying the output signal 33 in accordance with the low pass filter output signal 34 from the low pass filter 24. The divider circuit 22 receives the output signal 33 from the voltage control oscillator circuit 23 for diving this output signal 33 so as to output divided signals from the output signal 33.

Figure 2:
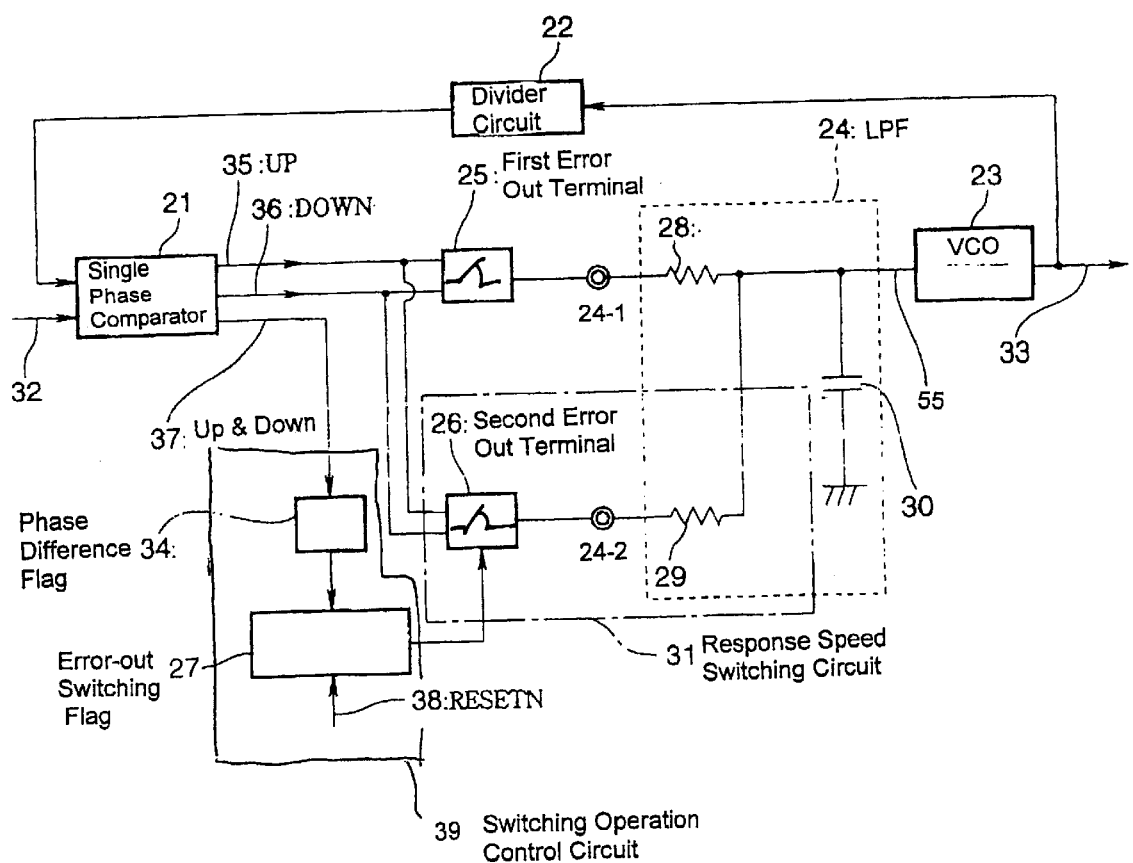
FIG. 2 is a block diagram illustrative of a novel high speed lock-up low noise phase locked loop circuit in accordance with the present invention.
Figure 3:
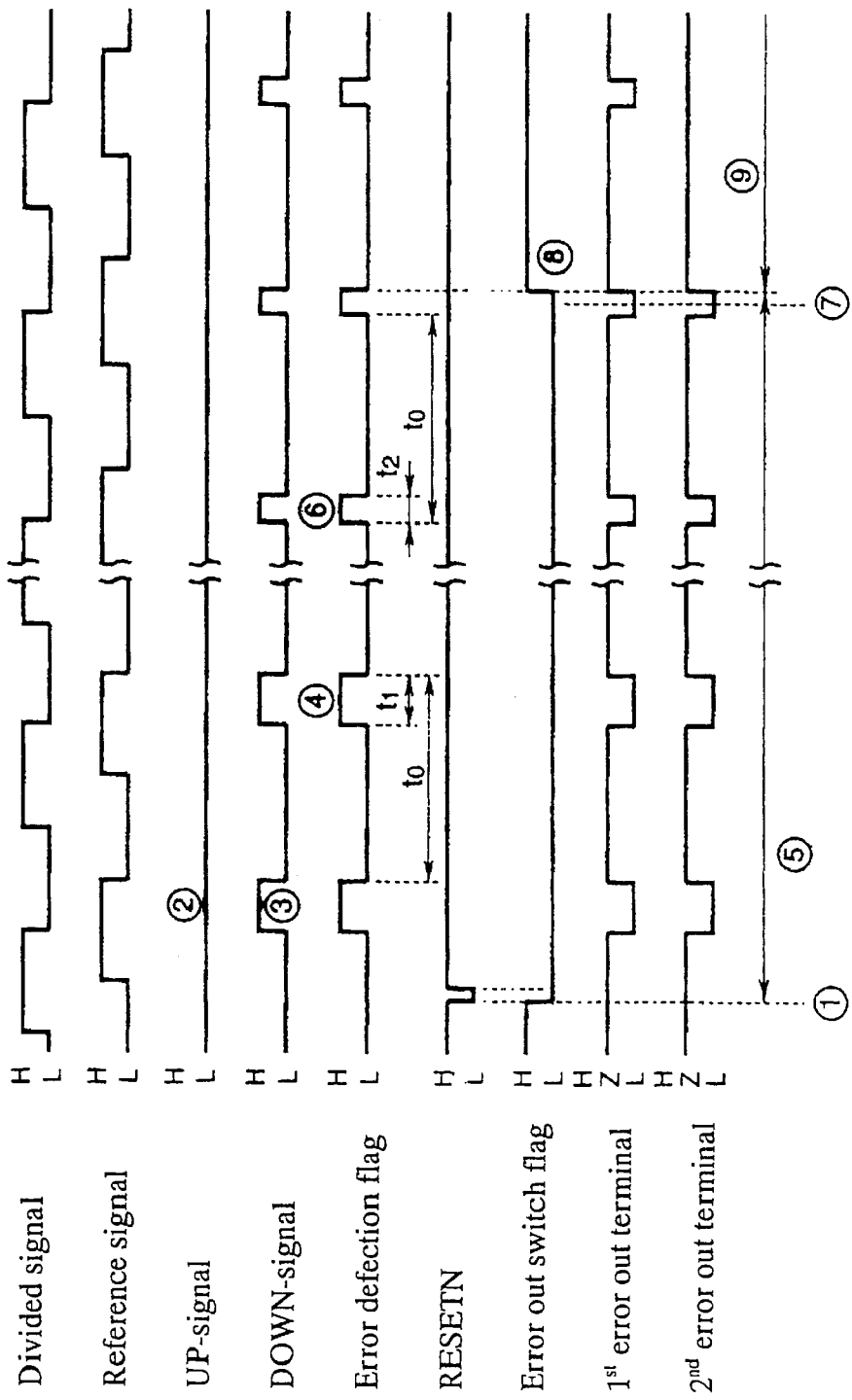
FIG. 3 is a timing chart of various signals transmitting throughout the above novel high speed lock-up phase locked loop circuit of FIG. 2.

FIG. 3 is a timing chart of various signals transmitting throughout the above novel high speed lock-up phase locked loop circuit of FIG. 2.

In a frequency switching operation starting period, the above novel high speed lock-up phase locked loop circuit is require to exhibit high speed performances, for which reason the error out switching flag 27 is made reset by input of the reset signal "RESETN" into the error out switching flag 27 at a first timing ① in order to place the second error out terminal 26 in an operational state, whereby the second error out terminal 26 makes the response speed switching circuit 31 become connected to the high speed lock-up phase locked loop circuit, thereby allowing the high speed lock-up phase locked loop circuit to exhibit the required high speed performances at a second timing ②. When the second error out terminal 26 in the operational state, the low pass filter 24 becomes comprising the first and second resistances 28 and 29 and the capacitor 30.

The single phase comparator 21 compares the divided output signal from the divider circuit 22 with reference to the reference signal 32 externally inputted in order to detect a phase difference of the divided output signal from the divider circuit 22 from the reference signal 32 so that the single phase comparator 21 outputs, at a third timing ③, the phase difference signals, for example, the UP-signal 35, the DOWN-signal 36 and the UP+DOWN signal 37 which corresponds to the logical sum of the UP-signal 35 and the DOWN-signal 36. In FIG. 3, the phase of the divided output signals from the divider circuit 22 is earlier that the phase of the reference signal 32. In the case, the first and second error out terminals 25 and 26 are changed from the high impedance state as the unoperational state into the operational state where the first and second error out terminals 25 and 26 are operable to output the low level signals "L" which are further transmitted through the first and second resistances 28 and 29 respectively, whereby the capacitor enters into a discharge state. The discharge from the capacitor 30 varies the voltage level of the low pass filter output signal 34 which is to be inputted into the voltage control oscillator 23. This variation in voltage level of the low pass filter output signal 34 to be inputted into the voltage control oscillator 23 causes the output signal 33 from the voltage control oscillator 23 to approach in phase and frequency to desired values. A response time T1 defined from the inputs of the UP-signal 35 and the DOWN-signal 36 into the first and second error out terminals 25 and 26 up to the output of the low pass filter output signal 34 from the low pass filter 24. This response time is calculated as follows.

If the phase difference between the divided output signals from the divider circuit 22 and the reference signal 22 is beyond the predetermined allowable range, then the above novel high speed lock-up phase locked loop circuit is in a non-lock-up state. If the phase difference between the divided output signals from the divider circuit 22 and the reference signal 32 is within the predetermined allowable range, then the above novel high speed lock-up phase locked loop circuit is in a lock-up state.

When the above novel high speed lock-up phase locked loop circuit is in the non-lock-up state, then the above defined response time T1 is given by the following equation.

$$T1=(C/2)\int[R-\sqrt{(K^2(Vgs-Vt)^2+KI(v))/KI(v)}]dv \quad (1)$$

$$K=\{W/(2L)\}\{\epsilon_{si}/Tox\}\mu$$

where "C" is the capacitance of the capacitor 30, "I" is the driving current for driving the first and second error out terminals 25 and 26, "R" is the resistance of each of the first and second resistances 28 and 29, "Vt" is a threshold voltage of MOS field effect transistors in each of the first and second error out terminals 25 and 26, "Vgs" is the gate-source voltage of MOS field effect transistors in each of the first and second error out terminals 25 and 26, "W" is the channel width of the MOS field effect transistors, "L" is the channel length of the MOS field effect transistors, "ϵsi" is the dielectric constant of the silicon layer of the MOS field effect transistors, "Tox" is the thickness of the gate oxide layer of the MOS field effect transistors, "$\mu$" is the mobility of the carriers in the channel region of the MOS field effect transistors.

The above high speed lock-up phase locked loop circuit comes closer to the lock-up state as the time passes, and then the phase difference between the divided output signals from the divider circuit 22 and the reference signal 32 becomes within the predetermined allowable range, before the response speed switching circuit is operated to switch the above high speed lock-up phase locked loop circuit into the low speed response state.

Subsequently, the operation of the above novel high speed lock-up phase locked loop circuit having been switched into the low speed response state from the high speed response state will be described with reference again to FIG. 3.

The single phase comparator 21 compares the divided output signal from the divider circuit 22 with reference to the reference signal 32 externally inputted in order to defect a phase difference of the divided output signal from the divider circuit 22 from the reference signal 32 so that the single phase comparator 21 outputs the phase difference signals, for example, the UP-signal 35, the DOWN-signal 36 and the UP+DOWN signal 37 which corresponds to the logical sum of the UP-signal 35 and the DOWN-signal 36, wherein the UP-signal 35 or the DOWN-signal 36 is in the high level "H". The error detection flag 34 receives the UP+DOWN signal 37 which corresponds to the logical sum of the UP-signal 35 and the DOWN-signal 36 so that the output signal from the error detection flag 34 becomes high level concurrently. A time duration of the high level of the output signal from the error detection flag 34 is proportional to the frequency difference or the phase difference between the divided output signals from the divider circuit 22 and the reference signal 32. The error detection flag 34 is continuously monitored in a predetermined time period. If the high level time period is within the predetermined time period, then the frequency difference and the phase difference between the divided output signal from the divider circuit 22 and the reference signal 32 are considered to be converged into the predetermined allowable ranges.

In FIG. 3, the predetermined allowable time period range "t2" is defined and the high level time period "t1" is also defined at a fourth timing ④ within a time period "t0" of the error detection flag 34 after the error out switching flag 27 is made reset by input of the reset signal "RESETN" into the error out switching flag 27 at a first timing ① in order to place the second error out terminal 26 in an operational state. During the high response time period ⑤, the second error out terminal 26 is maintained in the operational state and the response time T1 is defined from the inputs of the UP-signal 35 and the DOWN-signal 36 into the first and second error out terminals 25 and 26 up to the output of the low pass filter output signal 34 from the low pass filter 24. After the predetermined time has passed, the high level time reaches the predetermined allowable time period range "t2" ⑥. The error out switching flag 27 is made set by a software program executed by an external microcomputer externally provided ⑦. The error out switching flag 27 is allowed to change the output but one time only when the error detective flag 34 is in an inactive state after the error out switching flag 27 has been made reset. If the error detective flag 34 is in this inactive state, then this means that all of the first and second error out terminals 25 and 26 are in the high impedance state. The error out switching flag 27 is allowed to change the output but one time only when the error detection flag 34 is in an inactive state after the error out switching flag 27 has been made reset. After the error detective flag 34 has been fallen, then the output from the error out switching flag 27 is changed ⑧, whereby the second error out terminal 26 is made into the high impedance state ⑨ as the inactive state, so that the response speed switching circuit 31 is disconnected from the high speed lock-up phase locked loop circuit.

The response time T2 is defined from the input of the UP-signal 35 and the DOWN-signal 36 into the first error out terminal 25 up to the output of the low pass filter output signal 34 from the low pass filter 24. When the above novel high speed lock-up phase locked loop circuit is in the non-lock-up state, then the above defined response time T2 is also given by the following equation.

$$T2=C\int[R-\{K-\sqrt{(K^2(Vgs-Vt)^2+KI(v))/KI(v)}\}]dv \qquad (2)$$

$$K=\{W/(2L)\}\{\epsilon si/TOX\}\mu$$

where "C" is the capacitance of the capacitor 30, "I" is the driving current for driving the first and second error out terminals 25 and 26, "R" is the resistance of each of the first and second resistances 28 and 29, "Vt" is a threshold voltage of MOS field effect transistors in each of the first and second error out terminals 25 and 26, "Vgs" is the gate-source voltage of MOS field effect transistors in each of the first and second error out terminals 25 and 26, "W" is the channel width of the MOS field effect transistors, "L" is the channel length of the MOS field effect transistors, "$\epsilon si$" is the dielectric constant of the silicon layer of the MOS field effect transistors, "Tox" is the thickness of the gate oxide layer of the MOS field effect transistors, "$\mu$" is the mobility of the carriers in the channel region of the MOS field effect transistors.

As described above, if the second error out terminal 26 is in the operational state, then the response speed switching circuit is connected to the above high speed lock-up phase locked loop circuit, whereby the high speed lock-up phase locked loop circuit is placed in the high speed response state where the high speed lock-up phase locked loop circuit is allowed to exhibit the high speed performances. If the second error out terminal 26 is in the unoperational state and in the high impedance state, then the response speed switching circuit is disconnected from the above high speed lock-up phase locked loop circuit, whereby the high speed lock-up phase locked loop circuit is placed in the low speed response state where the high speed lock-up phase locked loop circuit is allowed to exhibit the low speed performances.

With reference to the above equations (1) and (2), the high speed response time of the high speed lock-up phase locked loop circuit in the high speed response state is compared to the low speed response time of the low speed lock-up phase locked loop circuit in the low speed response state. As a result of this comparison, the following equation (3) is given.

$$T1T2=\frac{1}{2} \qquad (3)$$

As described above, the high speed response time T1 is defined from the inputs of the UP-signal 35 and the DOWN-signal 36 into the first and second error out terminals 25 and 26 up to the output of the low pass filter output signal 34 from the low pass filter 24, whilst the low speed response time T2 is defined from the input of the UP-signal 35 and the DOWN-signal 36 into the first error but terminal 25 up to the output of the low pass filter output signal 34 from the low pass filter 24. The ratio of the high speed response time T1 to the low speed response time T2 is 1:2. Namely, the high speed response time T1 is a half of the low speed response time T2. During the high speed response state, the response speed switching circuit 31 including the second error out terminal 26 and the second resistance 29 is connected to the high speed lock-up phase locked loop circuit is placed in the high speed lock-up phase locked loop circuit, for which reason the high speed lock-up phase locked loop circuit is placed in the high speed response state where the high speed lock-up phase locked loop circuit is allowed to exhibit the high speed performances. During the high speed response state, the response speed switching circuit 31 including the second error out terminal 26 and the second resistance 29 is disconnected from the high speed lock-up phase locked loop circuit, for which reason the high speed lock-up phase locked loop circuit is placed in the low speed response state where the high speed lock-up phase locked loop circuit is allowed to exhibit the low speed performances. Switching operations for switching the response speed switching circuit to be connected to or disconnected from the high speed lock-up phase locked loop circuit would provide the switching operation of switching the high speed lock-up phase locked loop circuit into the high response state or in the low response state.

Only when the error detection flag 34 is in the non-active state, the second error out terminal 26 is allowed to be switched into the high impedance state. This means that the second error out terminal 26 is allowed to be switched into the high impedance state when the first and second error out terminals 25 and 26 are in the high impedance state. Since the first and second error out terminals 25 and 26 being in the high impedance state do not drive the low pass filter 24, then the driving current for the second error but terminal 26 is allowed to be switched without providing any influence to the high speed lock-up phase locked loop circuit. As a modification to the above embodiment, it is possible to find or calculate the high speed and low speed response times T1 and T2 even if the first and second error out terminals 25 and 26 are different in driving current from each other and also if the first and second resistances 28 and 29 are different from each other.

In accordance with the above novel high speed lock-up phase locked loop circuit, there are provided the single phase comparator 21 and the response speed switching circuit 31 as well as the control circuit 39. The control circuit 39 controls switching operations of switching the response speed switching circuit 31 to be connected to the novel high speed lock-up phase locked loop circuit so as to place the novel high speed lock-up phase locked loop circuit into the high response state or disconnected from the novel high speed lock-up phase locked loop circuit so as to place the novel high speed lock-up phase locked loop circuit into the low response state. The above novel high speed lock-up phase locked loop circuit is configured by use of the first and second error out terminals, for which reason the above novel high speed lock-up phase locked loop circuit is allowed to be switched between into the high response speed state and into the low response speed state without, however, enlarging any circuit scale.

The above novel high speed lock-up phase locked loop circuit has a plurality of the error out terminals, at least one of which is connected to an error out terminal control circuit for switching the one error out terminal into the high impedance state. Only when the error out terminals are in the high impedance state, the error out terminal is allowed to be switched in driving current, for which reason the above novel high speed lock-up phase locked loop circuit is free from any deteriorations in characteristics and performances due to the discontinuity in frequency and switching noises when the error but terminal is switched in driving current.

The error detection flag is provided for monitoring the errors of the single phase comparator, so that the error detection flag is monitored every constant time period so as to detect a difference in phase or frequency of the divided outputs from the divider circuits with reference to the reference signal, whereby after the difference in phase or frequency of the divided outputs from the divider circuits with reference to the reference signal has been converged into a predetermined allowable range, then the response speed switching circuit is switched to become connected to or disconnected from the high speed lock-up phase locked loop circuit, thereby switching the high speed lock-up phase locked loop circuit into the high speed response state or into the low speed response state.

The error out switching flag is provided to switch at least one of the plural error out terminals into the high impedance state, so as to control the timing of switching the error out terminal into the high impedance state and the operational state.

Figure 4:
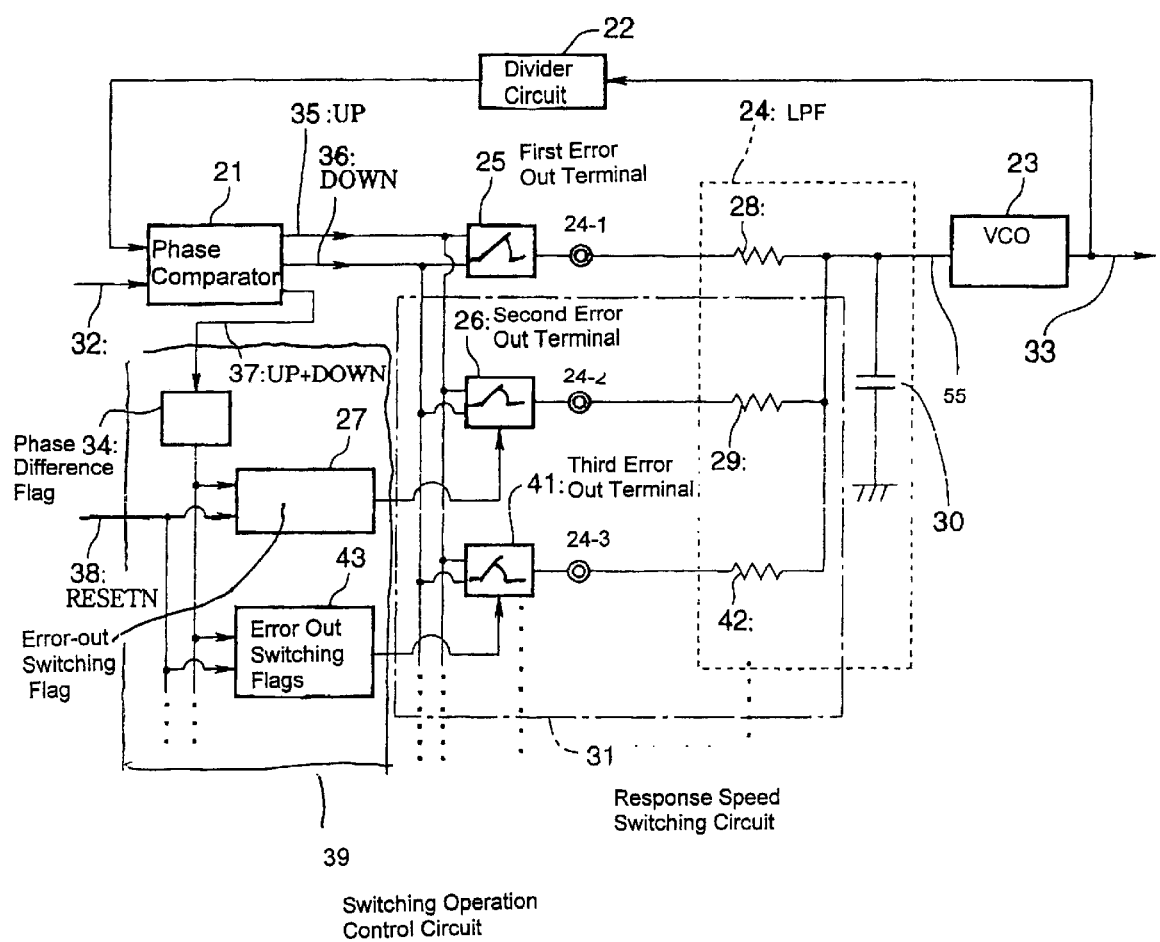
FIG. 4 is a block diagram illustrative of another novel high speed lock-up low noise phase locked loop circuit in accordance with the present invention.

A second embodiment according to the present invention will be described in detail with reference to FIG. 4 which is a block diagram illustrative of another novel high speed lock-up low noise phase locked loop circuit. The novel high speed lock-up phase locked loop circuit has the following circuit elements. A single phase comparator 21 is provided which may reduce a circuit scale. A divider circuit 22 is also provided which has an output side connected to an input side of the phase comparator 21 for allowing the single phase comparator 21 receives an output signal from the divider circuit 22. The single phase comparator 21 also receives a reference signal 32 for carrying out a phase comparison between the output signal from the divider circuit 22 with reference to the reference signal 32 so that the single phase comparator 21 is operable to output an UP-signal 35, a DOWN-signal 36, and an UP+DOWN signal 37 which corresponds to a logical sum of the UP-signal 35 and the DOWN-signal 36. A voltage control oscillator 23 is provided which has an output side connected to an input side of the divider circuit 22 for transmitting an output signal 33 from the voltage control oscillator 23 to the divider circuit 22. This output signal is also fetched as the output signal of the novel high speed lock-up low noise phase locked loop circuit. A low pass filter 24 is also provided which has an output side connected to an input side of the voltage control oscillator 23 for transmitting a low pass filter output signal 34 from the low pass filter 24 to the voltage control oscillator 23. A first error but terminal 25 is provided which is connected to both a first input terminal 24-1 of the low pass filter 24 and output terminals of the single phase comparator 21 for receiving both the UP-signal 35 and the DOWN-signal 36 from the single phase comparator 21. A response speed switching circuit 31 is also provided which has an input side connected to the output side of the single phase comparator 21 for receiving both the UP-signal 35 and the DOWN-signal 36 from the single phase comparator 21. The response speed switching circuit 31 is also provided which has an output side connected to the low pass filter 24. The low pass filter 24 has a first resistance 28 connected in series between the first input terminal 24-1 and the voltage control oscillator 23, a second resistance 29 connected in series between the second input terminal 24-2 and the voltage control oscillator 23, a third resistance 42 connected in series between the third input terminal 24-3 and the voltage control oscillator 23, and a capacitor 30 connected in series between the ground line and the voltage control oscillator 23. The response speed switching circuit 31 also has a second error out terminal 26 which is connected to both the second input terminal 24-2 of the low pass filter 24 and the output terminals of the single phase comparator 21 for receiving both the UP-signal 35 and the DOWN-signal 36 from the single phase comparator 21 as well as commonly has the second resistance 29 to the low pass filter 24, and further has a third error out terminal 41 which is connected to both the third input terminal 24-3 of the low pass filter 24 and the output terminals of the single phase comparator 21 for receiving both the UP-signal 35 and the DOWN-signal 36 from the single phase comparator 21 as well as commonly has the third resistance 42 to the low pass filter 24. An error out terminal control circuit 39 is also provided which has an input side connected to the output side of the single phase comparator 21 for receiving, from the single phase comparator 21, the UP+DOWN signal 37 which corresponds to the logical sum of the UP-signal 35 and the DOWN-signal 36. The error out terminal control circuit 39 also receives a reset signal "RESETN". The error out terminal control circuit 39 has an output side connected to the second error out terminal 26 for transmitting an output signal from the error out terminal control circuit 39. The error out terminal control circuit 39 further comprises a phase difference defective flag 34, a first error out switching flag 27 and a second error out switching flag 43. The phase difference defective flag 34 has an input side connected to the output side of the single phase comparator 21 for receiving, from the single phase comparator 21, the UP+DOWN signal 37 which corresponds to the logical sum of the UP-signal 35 and the DOWN-signal 36. The first error out switching flag 27 has an input side connected to the output from the phase difference defective flag 34. The first error out switching flag 27 also receives the reset signal 38 "RESETN". The first error out switching flag 27 has an output side connected to the second error out terminal 26 for transmitting the output signal from the error out switching flag 27 to the second error out terminal 26. The second error out switching flag 43 has an input side connected to the output from the phase difference defective flag 34. The second error out switching flag 43 also receives the reset signal 38 "RESETN". The second error out switching flag 43 has an output side connected to the third error out terminal 41 for transmitting the output signal from the error out switching flag 27 to the second error out terminal 26.

The following descriptions will focus on the operations of the above novel high speed lock-up phase locked loop circuit with reference again to FIG. 4.

The reference signal 32 and the output signal from the divider circuit 22 are inputted into the single phase comparator 21 so that the single phase comparator 21 is operated to compare the output signal from the divider circuit 22 with reference to the reference signal 32 in order to detect a phase difference of the output signal from the reference signal 32 and outputs the three output signals, for example, the UP-signal 35, the DOWN-signal 36 and the UP+DOWN signal 37 which corresponds to the logical sum of the UP-signal 35 and the DOWN-signal 36. The UP-signal 35 and the DOWN-signal 36 from the single phase comparator 21 are inputted into the first error out terminal 25 so that the first error out terminal 25 outputs, a high level signal "H", a low level signal "L" and a high impedance. The second error but terminal 26 receives the UP-signal 35 and the DOWN-signal 36 from the single phase comparator 21 as well as the output signal from the first error out switching flag 27. The third error out terminal 41 receives the UP-signal 35 and the DOWN-signal 36 from the single phase comparator 21 as well as the output signal from the second error out switching flag 43. The output signal from the first error out terminal 25 is inputted into the first terminal 24-1 of the low pass filter 24 so that the first resistance 28 receives the output signal from the first error out terminal 25. The output signal from the second error out terminal 26 is inputted into the second terminal 24-2 of the low pass filter 24 so that the second resistance 29 receives the output signal from the second error out terminal 26. The output signal from the third error out terminal 41 is inputted into the third terminal 24-3 of the low pass filter 24 so that the third resistance 42 receives the output signal from the third error out terminal 41.

The error detective flag 34 receives the UP+DOWN signal 37 from the single phase comparator 21. The UP+DOWN signal 37 corresponds to the logical sum of the UP-signal 35 and the DOWN-signal 36, for which reason if at least any one of the UP-signal 35 and the DOWN-signal 36 is in an activated state, the the UP+DOWN signal 37 is in an active state. Only if both the UP-signal 35 and the DOWN-signal 36 are in an inactivated state, then the UP+DOWN signal 37 is in an inactive state. If the UP+DOWN signal 37 is in the active state, then the error detective flag 34 is made set. If, however, the UP+DOWN signal 37 is in the inactive state, then the error detective flag 34 is made reset. The first error out switching flag 27 is connected to the second error out terminal 26 for switching the second error out terminal 26 between in an operational state and a high impedance unoperational state. The first error out switching flag 27 is made reset by the input of the reset signal "RESETN". The first error out switching flag 27 is made set by a software program executed by an external microcomputer externally provided. The first error out switching flag 27 is allowed to change the output but one time only when the error detective flag 34 is in an inactive state after the first error out switching flag 27 has been made reset. The second error out switching flag 43 is connected to the third error out terminal 41 for switching the third error out terminal 41 between in an operational state and a high impedance unoperational state. The second error out switching flag 43 is made reset by the input of the reset signal "RESETN". The second error out switching flag 43 is made set by a software program executed by an external microcomputer externally provided. The second error out switching flag 43 is allowed to change the output but one time only when the error detective flag 34 is in an inactive state after the second error out switching flag 43 has been made reset. If the error detective flag 34 is in this inactive state, then this means that all of the first, second and third error out terminals 28, 29 and 43 are in the high impedance state.

The voltage control oscillator circuit 23 is capable of varying the output signal 33 in accordance with the low pass filter output signal 34 from the low pass filter 24. The divider circuit 22 receives the output signal 33 from the voltage control oscillator circuit 23 for diving this output signal 33 so as to output divided signals from the output signal 33.

In a frequency switching operation starting period, the above novel high speed lock-up phase locked loop circuit is require to exhibit high speed performances, for which reason the first and second error out switching flags 27 and 43 are made reset by input of the reset signal "RESETN" into the first and second error out switching flags 27 and 43 in order to place the second and third error out terminals 26 and 41 in an operational state, whereby the second and third error out terminals 26 and 41 makes the response speed switching circuit 31 become connected to the high speed lock-up phase locked loop circuit, thereby allowing the high speed lock-up phase locked loop circuit to exhibit the required high speed performances. When the second error out terminal 26 and the third error out terminal 41 are in the operational state, the low pass filter 24 becomes comprising the first, second and third resistances 28, 29 and 42 and the capacitor 30.

The single phase comparator 21 compares the divided output signal from the divider circuit 22 with reference to the reference signal 32 externally inputted in order to defect a phase difference of the divided output signal from the divider circuit 22 from the reference signal 32 so that the single phase comparator 21 outputs the phase difference signals, for example, the UP-signal 35, the DOWN-signal 36 and the UP+DOWN signal 37 which corresponds to the logical sum of the UP-signal 35 and the DOWN-signal 36. When the phase of the divided output signals from the divider circuit 22 is earlier than the phase of the reference signal 32, the first, second and third error out terminals 25, 26 and 41 are changed from the high impedance state as the unoperational state into the operational state where the first, second and third error out terminals 25, 26 and 41 are operable to output the low level signals "L" which are further transmitted through the first, second and third resistances 28, 29 and 42 respectively, whereby the capacitor 30 enters into a discharge state. The discharge from the capacitor 30 varies the voltage level of the low pass filter output signal 34 which is to be inputted into the voltage control oscillator 23. This variation in voltage level of the low pass filter output signal 55 to be inputted into the voltage control oscillator 23 causes the output signal 33 from the voltage control oscillator 23 to approach in phase and frequency to desired values. A response time T1 defined from the inputs of the UP-signal 35 and the DOWN-signal 36 into the first, second and third error out terminals 25, 26 and 41 up to the output of the low pass filter output signal 34 from the low pass filter 24. This response time is calculated as follows.

If the phase difference between the divided output signals from the divider circuit 22 and the reference signal 32 is beyond the predetermined allowable range, then the above novel high speed lock-up phase locked loop circuit is in a non-lock-up state. If the phase difference between the divided output signals from the divider circuit 22 and the reference signal 32 is within the predetermined allowable range, then the above novel high speed lock-up phase locked loop circuit is in a lock-up state.

The above high speed lock-up phase locked loop circuit comes closer to the lock-up state as the time passes, and then the phase difference between the divided output signals from the divider circuit 22 and the reference signal 32 becomes within the predetermined allowable range, before the response speed switching circuit is operated to switch the above high speed lock-up phase locked loop circuit into the low speed response state.

Subsequently, the operation of the above novel high speed lock-up phase locked loop circuit having been switched into the low speed response state from the high speed response state will be described.

The single phase comparator 21 compares the divided output signal from the divider circuit 22 with reference to the reference signal 32 externally inputted in order to defect a phase difference of the divided output signal from the divider circuit 22 from the reference signal 32 so that the single phase comparator 21 outputs the phase difference signals, for example, the UP-signal 35, the DOWN-signal 36 and the UP+DOWN signal 37 which corresponds to the logical sum of the UP-signal 35 and the DOWN-signal 36, wherein the UP-signal 35 or the DOWN-signal 36 is in the high level "H". The error detection flag 34 receives the UP+DOWN signal 37 which corresponds to the logical sum of the UP-signal 35 and the DOWN-signal 36 so that the output signal from the error detection flag 34 becomes high level concurrently. A time duration of the high level of the output signal from the error detection flag 34 is proportional to the frequency difference or the phase difference between the divided output signals from the divider circuit 22 and the reference signal 32. The error detection flag 34 is continuously monitored in a predetermined time period. If the high level time period is within the predetermined time period, then the frequency difference and the phase difference between the divided output signals from the divider circuit 22 and the reference signal 32 are considered to be converged into the predetermined allowable ranges.

During the high response time period, the second and third error out terminals 26 and 41 are maintained in the operational state and the response time T1 is defined from the inputs of the UP-signal 35 and the DOWN-signal 36 into the first, second and third error out terminals 25, 26 and 41 up to the output of the low pass filter output signal 34 from the low pass filter 24. After the predetermined time has passed, the high level time reaches the predetermined allowable time period range. The first and second error out switching flags 27 and 43 are made set by a software program executed by an external microcomputer externally provided. The first and second error out switching flags 27 and 43 are allowed to change the output but one time only when the error detective flag 34 is in an inactive state after the first and second error out switching flags 27 and 43 have been made reset. If the error detective flag 34 is in this inactive state, then this means that all of the first, second and third error out terminals 25, 26 and 41 are in the high impedance state. The first and second error out switching flags 27 and 43 are allowed to change the output but one time only when the error detective flag 34 is in an inactive state after the first and second error out switching flags 27 and 43 have been made reset. After the error detective flag 34 has been fallen, then the outputs from the first and second error out switching flags 27 and 43 are changed, whereby the second and third error out terminals 26 and 41 are made into the high impedance state as the inactive state, so that the response speed switching circuit 31 is disconnected from the high speed lock-up phase locked loop circuit.

As described above, if the second and third error out terminals 26 and 41 are in the operational state, then the response speed switching circuit is connected to the above high speed lock-up phase locked loop circuit, whereby the high speed lock-up phase locked loop circuit is placed in the high speed response state where the high speed lock-up phase locked loop circuit is allowed to exhibit the high speed performances. If the second and third error but terminals 26 and 41 are in the unoperational state and in the high impedance state, then the response speed switching circuit is disconnected from the above high speed lock-up phase locked loop circuit, whereby the high speed lock-up phase locked loop circuit is placed in the low speed response state where the high speed lock-up phase locked loop circuit is allowed to exhibit the low speed performances.

As described above, the high speed response time T1 is defined from the inputs of the UP-signal 35 and the DOWN-signal 36 into the first, second and third error out terminals 25, 26 and 41 up to the output of the low pass filter output signal 34 from the low pass filter 24, whilst the low speed response time T2 is defined from the input of the UP-signal 35 and the DOWN-signal 36 into the first error out terminal 25 up to the output of the low pass filter output signal 34 from the low pass filter 24. The ratio of the high speed response time T1 to the low speed response time T2 is 1:2. Namely, the high speed response time T1 is a half of the low speed response time T2. During the high speed response state, the response speed switching circuit 31 including the second and third error out terminals 26 and 41 and the second and third resistances 29 and 42 is connected to the high speed lock-up phase locked loop circuit, for which reason the high speed lock-up phase locked loop circuit is placed in the high speed response state where the high speed lock-up phase locked loop circuit is allowed to exhibit the high speed performances. During the high speed response state, the response speed switching circuit 31 including the second and third error out terminals 26 and 41 and the second and third resistances 29 and 42 is disconnected from the high speed lock-up phase locked loop circuit, for which reason the high speed lock-up phase locked loop circuit is placed in the low speed response state where the high speed lock-up phase locked loop circuit is allowed to exhibit the low speed performances. Switching operations for switching the response speed switching circuit to be connected to or disconnected from the high speed lock-up phase locked loop circuit would provide the switching operation of switching the high speed lock-up phase locked loop circuit into the high response state or in the low response state.

Only when the error detection flag 34 is in the non-active state, the second and third error out terminals 26 and 41 are allowed to be switched into the high impedance state. This means that the second and third error out terminals 26 and 41 are allowed to be switched into the high impedance state when the first, second and third error out terminals 25, 26 and 41 are in the high impedance state. Since the first, second and third error out terminals 25, 26 and 41 being in the high impedance state do not drive the low pass filter 24, then the driving current for the second and third error out terminals 26 and 41 are allowed to be switched without providing any influence to the high speed lock-up phase locked loop circuit.

In accordance with the above novel high speed lock-up phase locked loop circuit, there are provided the single phase comparator 21 and the response speed switching circuit 31 as well as the control circuit 39. The control circuit 39 controls switching operations of switching the response speed switching circuit 31 to be connected to the novel high speed lock-up phase locked loop circuit so as to place the novel high speed lock-up phase locked loop circuit into the high response state or disconnected from the novel high speed lock-up phase locked loop circuit so as to place the novel high speed lock-up phase locked loop circuit into the low response state. The above novel high speed lock-up phase locked loop circuit is configured by use of the first and second error out terminals, for which reason the above novel high speed lock-up phase locked loop circuit is allowed to be switched between into the high response speed state and into the low response speed state without, however, enlarging any circuit scale.

The above novel high speed lock-up phase locked loop circuit has a plurality of the error out terminals, at least one of which is connected to an error out terminal control circuit for switching the one error out terminal into the high impedance state. Only when the error out terminals are in the high impedance state, the error out terminal is allowed to be switched in driving current, for which reason the above noel high speed lock-up phase locked loop circuit is free from any deteriorations in characteristics and performances due to the discontinuity in frequency and switching noises when the error out terminal is switched in driving current.

The error detection flag is provided for monitoring the errors of the single phase comparator, so that the error detection flag is monitored every constant time period so as to detect a difference in phase or frequency of the divided outputs from the divider circuits with reference to the reference signal, whereby after the difference in phase or frequency of the divided outputs from the divider circuits with reference to the reference signal has been converged into a predetermined allowable range, then the response speed switching circuit is switched to become connected to or disconnected from the high speed lock-up phase locked loop circuit, thereby switching the high speed lock-up phase locked loop circuit into the high speed response state or into the low speed response state.

The error out switching flag is provided to switch at least one of the plural error out terminals into the high impedance state, so as to control the timing of switching the error out terminal into the high impedance state and the operational state.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuitry for controlling a response speed of a phase locked loop circuit, said circuitry comprising:

a response speed switching circuit having at least one resistive element with a resistance; and a switching operation control circuit being connected to a phase comparator in said phase locked loop circuit for receiving output signals from said phase comparator, and said switching operation control circuit being also connected to said response speed switching circuit for transmitting selected one of first and second switching control signals to said response speed switching circuit, so that if said response speed switching circuit receives said first switching control signal from said switching operation control circuit, then said response speed switching circuit becomes connected to said phase locked loop circuit, whereby both ends of said at least one resistive element becomes connected to said phase locked loop circuit so as to place said phase locked loop circuit into a high speed response state, and so that if said response speed switching circuit receives said second switching control signal from said switching operation control circuit, then said response speed switching circuit becomes disconnected from said phase locked loop circuit, whereby one end of said at least one resistive element becomes disconnected from said phase locked loop circuit so as to place said phase locked loop circuit into a low speed response state.

2. The circuitry as claimed in claim 1, wherein said response speed switching circuit has at least one series connection of an error out terminal and a resistance as said resistive element, and said error out terminal is switched between in an operational state in accordance with an input of said first switching control signal and in a high impedance state as an unoperational state in accordance with an input of said second switching control signal.

3. The circuitry as claimed in claim 2, wherein said resistance of said response speed switching circuit is common to a low pass filter of said phase locked loop circuit, and said error out terminal of said response speed switching circuit is connected to said low pass filter.

4. The circuitry as claimed in claim 3, wherein said switching operation control circuit has an error detector connected to said phase comparator of said phase locked loop circuit for receiving an output signal from said phase comparator in order to detect whether or not a phase difference detected by said phase comparator is within a predetermined allowable range, so that if said phase difference is within said predetermined allowable range, then said error detector is made into an inactive state to allow said error out terminal to be placed into said high impedance state, and so that if said phase difference is beyond said predetermined allowable range, then said error detector is made into an active state to allow said error out terminal to be placed into said operational state.

5. The circuitry as claimed in claim 4, wherein said error detector comprises an error detecting flag.

6. The circuitry as claimed in claim 4, wherein said switching operation control circuit further comprises at least one error out switching element connected to said error detector and also connected to said error out terminal for switching said error out terminal into said high impedance state only when said error detector is in said inactive state to allow said response speed switching circuit to becomes disconnected from said phase locked loop circuit.

7. The circuitry as claimed in claim 6, wherein said at least one error out switching element comprises an error out switching flag.

8. The circuitry as claimed in claim 4, wherein said error detector receives an input signal which comprises a logical sum of first and second output signals being supplied from said phase comparator to said at least one error output terminal.

9. A phase locked loop circuit comprising:

a voltage control oscillator;

a divider connected to said voltage control oscillator for receiving an output signal from said voltage control oscillator;

a single phase comparator connected to said divider for receiving an output signal from said divider and also receiving a reference signal in order to compare said output signal with reference to said reference signal;

a first error out terminal connected to said single phase comparator for receiving output signals from said single phase comparator;

a low pass filter connected to said first error out terminal for receiving an output signal from said first error out terminal, and also connected to said voltage control oscillator for sending an output signal from said low pass filter to said voltage control oscillator; and a circuitry connected to both said single phase comparator and said low pass filter for receiving an output signal from said single phase comparator in order to control a response speed of said phase locked loop circuit in accordance with said output signal from said single phase comparator, wherein said circuitry comprises a response speed switching circuit having at least one resistive element with a resistance; and a switching operation control circuit being connected to said single phase comparator for receiving output signals from said phase comparator, and said switching operator control circuit being also connected to said response speed switching circuit for transmitting selected one of first and second switching control signals to said response speed switching circuit, so that if said response speed switching circuit receives said first switching control signal from said switching operation control circuit, then said response speed switching circuit becomes connected to said phase locked loop circuit, whereby both ends of said at least one resistive element becomes connected to said phase locked loop circuit so as to place said phase locked loop circuit into a high speed response state, and so that if said response speed switching circuit receives said second switching control signal from said switching operation control circuit, then said response speed switching circuit becomes disconnected from said phase locked loop circuit, whereby one end of said at least one resistive element becomes disconnected from said phase locked loop circuit so as to place said phase locked loop circuit into a low speed response state.

* * * * *